United States Patent
Grill et al.

(10) Patent No.: US 6,764,774 B2
(45) Date of Patent: Jul. 20, 2004

(54) STRUCTURES WITH IMPROVED ADHESION TO SI AND C CONTAINING DIELECTRICS AND METHOD FOR PREPARING THE SAME

(75) Inventors: Alfred Grill, White Plains, NY (US); Michael Lane, Cortlandt Manor, NY (US); Vishnubhai V. Patel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 10/174,748

(22) Filed: Jun. 19, 2002

(65) Prior Publication Data
US 2003/0235710 A1 Dec. 25, 2003

(51) Int. Cl.[7] .............................................. H01L 29/12

(52) U.S. Cl. ........................ 428/641; 428/620; 428/689; 428/698; 428/702; 428/704; 257/759; 257/760; 257/762; 257/763; 257/774; 257/751; 438/623; 438/624; 438/628; 438/680

(58) Field of Search ............................... 438/623–624, 438/628, 680; 428/641, 689, 698, 702, 704, 620; 257/759–760, 762–763, 774, 751

(56) References Cited

U.S. PATENT DOCUMENTS

| 4,647,494 A | 3/1987 | Meyerson et al. |
| 6,184,123 B1 * | 2/2001 | Ge et al. .................... 438/624 |
| 6,265,779 B1 * | 7/2001 | Grill et al. .................. 257/759 |

* cited by examiner

Primary Examiner—Deborah Jones
Assistant Examiner—Ling Xu
(74) Attorney, Agent, or Firm—Scully, Scott, Murphy & Presser; Robert M. Trepp, Esq.

(57) ABSTRACT

A semiconductor device structure and method for manufacture includes a substrate having a top first layer of dielectric material; a second layer of material selected from the group including: amorphous Silicon (a-Si), amorphous Ge (a-Ge) or alloys thereof, located on top of the first layer; and, a third layer located on top of the a-Si, a-Ge, or alloys thereof layer, wherein the second layer provides adhesion between the first and third layers of the structure. Additionally, a semiconductor device structure and method for manufacture includes an insulating structure comprising a multitude of dielectric and conductive layers with respective a-Si, a-Ge, or alloys thereof bonding layers disposed to enhance adhesion between the different layers. Further, an electronic device structure incorporates layers of insulating and conductive materials as intralevel or interlevel dielectrics in a back-end-of-the-line ("BEOL") wiring structure in which the adhesion between different dielectric is enhanced by an intermediate a-Si, a-Ge, or alloys thereof bonding layer. The thin a-Si, a-Ge, or alloys thereof layer may be hydrogenated or non-hydrogenated, or even partially oxidized.

63 Claims, 6 Drawing Sheets

STRUCTURES WITH IMPROVED ADHESION TO SI AND C CONTAINING DIELECTRICS AND METHOD FOR PREPARING THE SAME

BACKGROUND OF THE INVENTION

1. Field of the Invention

The present invention generally relates to a semiconductor electronic device structure comprising dielectric layers having improved adhesion to other dielectric or conducting layers. More particularly, the present invention relates to using a layer of amorphous silicon (a-Si) or amorphous Germanium (a-Ge) (or alloys thereof) as an adhesion enhancing interfacial layer. Furthermore, the present invention relates to a method for improving the adhesion between different dielectric or conductive layers including those that include Si or C.

2. Description of the Prior Art

The continuous shrinking in dimensions of electronic devices utilized in ULSI circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are being introduced to reduce the capacitances.

The low-k materials that have been considered for applications in ULSI devices include polymers containing Si, C, O and H, such as methylsiloxane, methylsilsesquioxanes, and other organic and inorganic polymers which are fabricated by spin-on techniques or, Si, C, O and H containing materials (SiCOH, SiOCH, carbon-doped oxides (CDO), silicon-oxicarbides, organosilicate glasses (OSG)) deposited by plasma enhanced chemical vapor deposition (CVD) techniques. The incorporation of the low-k dielectrics in the interconnect structures of integrated circuits (IC) often requires the use of other dielectric materials as diffusion barrier caps or etch-stop and chemo-mechanical polishing (CMP) hardmasks. The adhesion between the different layers in the complex structures of an IC device is often too low, resulting in delaminations during the processing of the device. This is especially true for adhesion of dielectric or metallic layers to $SiO_2$. Furthermore, an intermediate layer of refractory metal nitride is generally needed to provide suitable adhesion between the metallic Cu-diffusion barrier and the dielectric insulator of the interconnect structure. The conductive nitride layer, typically of lower conductivity than the metallization layers occupies a significant thickness of the shrinking metallization and increases its resistivity. The elimination of this conductive nitride layer by substituting it with a very thin adhesion layer can improve the performance of ULSI devices.

It would thus be highly desirable to provide a semiconductor device comprising an insulating structure including comprising a multitude of dielectric and conductive layers with good adhesion between the different layers, and a method for manufacturing said semiconductor device.

As described in U.S. Pat. No. 4,647,494, amorphous Silicon (a-Si) of tens of Angstroms thick has been recognized for improving adhesion of wear resistant carbon coatings to metallic magnetic recording layers in recording tapes and disks. That is, in U.S. Pat. No. 4,647,494, a-Si is described as improving adhesion between amorphous hydrogenated carbon (or diamondlike carbon) and silicide forming metals. The use of thin a-Si bonding layer has not been utilized in semiconductor ULSI manufacturing processes to enhance adhesion between dielectric layers of a semiconductor BEOL wiring structure.

It would thus be further highly desirable to provide a semiconductor device structure and method for manufacturing an insulating structure comprising a multitude of dielectric and conductive layers that includes thin a-Si, a-Ge or alloys thereof, bonding layers used to enhance adhesion between the different layers.

SUMMARY OF THE INVENTION

It is therefore an object of the present invention to provide an insulating structure comprising a multitude of dielectric and conductive layers with good adhesion between the different layers.

It is a further object of the present invention to provide an insulating structure comprising a multitude of dielectric and conductive layers wherein the adhesion between different layers is enhanced by a thin bonding layer comprising amorphous Si (a-Si), amorphous Ge (a-Ge) or alloys thereof, wherein the thin a-Si (a-Ge or alloys thereof) may be hydrogenated or non-hydrogenated.

It is another object of the present invention to provide an insulating structure comprising a multitude of dielectric and conductive layers wherein the adhesion between different layers is enhanced by a thin amorphous bonding layer comprising amorphous Si (a-Si), amorphous Ge (a-Ge) or alloys thereof, wherein the thin a-Si (a-Ge or alloys thereof) may be at least partially oxidized.

It is another object of the present invention to provide an insulating structure including a thin intermediate a-Si (a-Ge or alloys thereof) bonding layer adhesion layer for enhancing adhesion between an oxide layer, e.g., from the group comprising $SiO_2$, phosphorus silicate glass ("PSG") or boron phosphorus silicate glass ("BPSG"), and a layer from the group comprising SiCOH, SiC, SiCN, SiCH, or SiCNH.

It is yet another object of the present invention to provide an electronic device structure incorporating layers of insulating and conductive materials as intralevel or interlevel dielectrics in a back-end-of-the-line ("BEOL") wiring structure in which the adhesion between different dielectrics is enhanced by a thin intermediate a-Si bonding layer, or a bonding layer of a-Ge or alloys thereof.

It is still another object of the present invention to provide an electronic device structure incorporating layers of insulating and conductive materials as intralevel or interlevel dielectrics in a BEOL wiring structure in which the adhesion between the conductive layers and the different dielectric layers is enhanced by a thin intermediate a-Si bonding layer, or a bonding layer of a-Ge or alloys thereof.

It is still yet a further object of the present invention to provide a method for fabricating an a-Si adhesion layer (or a layer of a-Ge or alloys thereof) either in a parallel plate plasma enhanced chemical vapor deposition ("PECVD") reactor or, in a sputtering reactor.

It is yet another object of the present invention to provide an electronic device structure, which comprises at least one a-Si bonding layer (or a layer of a-Ge or alloys thereof) between a dielectric layer and a liner/barrier layer for a Cu metallization structure.

It is another object of the present invention to provide an insulating semiconductor structure comprising a multitude of dielectric and conductive layers wherein the adhesion between different layers is enhanced by a thin amorphous Si (a-Si) bonding layer (or a layer of a-Ge or alloys thereof) which may be at least partially oxidized.

According to the principles of the invention, there is provided a method for fabricating a BEOL interconnect structure with improved adhesion between the layers of the structure. The present invention further provides an electronic device structure that incorporates a-Si layers (or layers of a-Ge or alloys thereof) between dissimilar layers in the structure to improve the adhesion between them. In one embodiment, a thin a-Si layer, 1–100 nm, preferably 2–6 nm thick, is interposed between a silicon oxide layer and a SiCOH layer, enhancing the adhesion between the two layers. In another preferred embodiment, the 1–100 nm, preferably 2–6 nm thick a-Si layer is interposed between a SiCOH dielectric layer and a layer of SiN, SiC, SiCH, or SiCHN, to enhance the adhesion between the layers. In yet another embodiment, the 1–100 nm, preferably 2–6 nm thick a-Si layer is interposed between a dielectric layer and a Ta layer, to enhance the adhesion between the two layers.

In yet another embodiment, the a-Si layer (or a layer of a-Ge or alloys thereof) is incorporated between any two layers from the group comprising $SiO_2$, PSG, BPSG, SiN, SiC, SiCH, SiCHN, or SiCOH, Ta, Ti, and any other silicide forming metal, to improve the adhesion between the layers.

In an embodiment, the a-Si layer (or a layer of a-Ge or alloys thereof) is deposited after the hardmask layer which may be comprised of $SiO_2$, PSG, BPSG, SiN, SiC, SiCH or SiCHN which is then followed by the liner material such as Ta, Ti, W or their nitrides or silicides. The a-Si layer allows for the pure form of the metal to be deposited without concern for delamination on the metal/hardmask interface during CMP. The further benefit of depositing the pure metal is found at the via/line interface where pure metallic bonding is created which guarantees good adhesion and improves device reliability especially for thermal excursions and also has the added benefit of reducing contact resistance.

In another aspect of the invention, there is provided a method for fabricating a multilayered structure with strong adhesion between the different layers comprising the steps of: providing a plasma enhanced chemical vapor deposition ("PECVD") reactor: positioning an electronic device structure (i.e., substrate) having an upper layer of first dielectric in the reactor; flowing $SiH_4$ or $SiH_4$ diluted in an inert gas into the reactor; depositing a layer of a-Si on top of said substrate; flowing precursors into the reactor for depositing a second dielectric or conductive layer on top of the a-Si bonding layer. The second dielectric layer is preferably a SiCOH type dielectric of low dielectric constant (k<3.2) or ultralow dielectric constant (k<2.4) or a metal such as Ta, Ti, W, combinations of the previous, their silicides and/or nitrides.

In another embodiment, the step of depositing the a-Si adhesion layer (or a layer of a-Ge or alloys thereof) is repeated after the deposition of said second layer.

In yet another embodiment the a-Si layer (or a layer of a-Ge or alloys thereof) is at least partially oxidized by exposing it to an oxygen plasma after its deposition.

In a different embodiment, the substrate is removed from the PECVD reactor after the deposition of the a-Si layer and a said second dielectric layer from the group comprising organic polymers, silicon based polymers, organic glasses, hybrid Si and C containing polymers, oxides, or porous modifications of same materials is deposited by a spin-on method.

In yet a different embodiment, the substrate is removed from the PECVD reactor after the deposition of the a-Si layer and after exposing the a-Si layer to an oxygen plasma and a second dielectric layer from the group comprising organic polymers, silicon based polymers, organic glasses, hybrid Si and C containing polymers, oxides, is deposited by a spin-on method.

Dielectric layers such as ones aforementioned, or layers of metals that form silicides have good adhesion to the a-Si interlayer, therefore the a-Si intermediate layer enhances the adhesion between such layers. The a-Si can be deposited by any radiation assisted techniques, such as PECVD, high density plasma, sputtering, ion beam sputtering, ion beam deposition.

The adhesion enhancing a-Si layer can be used in the back end of the line (BEOL) structure of a CMOS device to improve the adhesion between a low-k dielectric, e.g. SiCOH, and $SiO_2$ or between a metal layer, e.g. Ta, and a dielectric.

The present invention is further directed to an electronic device structure which has layers of insulating materials as intralevel or interlevel dielectrics in a back-end-of-the-line ("BEOL") interconnect structure which includes a pre-processed semiconducting substrate that has a first region of metal embedded in a first layer of insulating material, a first region of conductor embedded in a second layer of insulating material, an adhesion layer of a-Si (or a layer of a-Ge or alloys thereof) between the second layer of insulating material and first layer of insulating material, the first region of conductor being in electrical contact with the first region of metal, and a second region of conductor being in electrical contact with the first region of conductor and being embedded in a third layer of insulating material, the third layer of insulating material contacting with the second layer of insulating material. The electronic device structure may further comprise a dielectric cap layer situated in between the second layer of insulating material and the third layer of insulating material and including a-Si adhesion layers between the cap layer and the second and optionally the third insulating layers.

The electronic device structure may further comprise a first dielectric cap layer between the second layer of insulating material and the third layer of insulating material, and a second dielectric cap layer on top of the third layer of insulating material and containing a-Si adhesion layers between the cap layers and the insulating layers.

The dielectric cap material can be selected from silicon oxide, silicon nitride, silicon oxynitride, a refractory metal silicon nitride (wherein the refractory metal is selected from the group consisting of Ta, Zr, Hf and W) silicon carbide, carbon doped oxide or SiCOH and their hydrogenated compounds. The first and the second dielectric cap layers may be selected from the same group of dielectric materials. The first layer of insulating material may be silicon oxide or silicon nitride or doped varieties of these materials, such as phosphorus silicate glass ("PSG") or boron phosphorus silicate glass ("BPSG"), SiC, SiCN, SiCH, or SiCNH. The second and subsequent dielectric layers may be PECVD deposited SiCOH or spin-on deposited dielectrics.

The electronic device structure may further include a diffusion barrier layer of a dielectric material deposited on at least one of the second and third layers of insulating material with an a-Si intermediate adhesion layer (or an adhesion layer of a-Ge or alloys thereof). The electronic device structure may further comprise a dielectric on top of the second layer of insulating material, which acts as a reactive ion etch ("RIE") hard mask and polish stop layer and a dielectric diffusion barrier layer on top of the dielectric RIE hard mask and polish stop layer, with an a-Si intermediate adhesion layer between said top dielectric and said second layer of insulating material. The electronic device structure may further comprise a first dielectric RIE hard mask/polish-stop layer on top of the second layer of insulating material, a first dielectric RIE hard mask/diffusion barrier layer on top of the first dielectric polish-stop layer, a second dielectric RIE hard mask/polish-stop layer on top of the third layer of insulating material, and a second dielectric diffusion barrier layer on top of the second dielectric polish-stop layer with a-Si adhesion layers between two layers of different materials. The electronic device structure may further comprise a dielectric cap layer of same materials as mentioned above, between an interlevel dielectric and an intralevel dielectric.

Advantageously, the method for improving the adhesion between the different layers of an electronic device structure using the a-Si adhesion layer is implemented in a back-end-of-the-line ("BEOL") wiring process. Thus, the electronic device structure comprises at least one a-Si bonding layer between the dielectric and conductive layers of a back-end-of-the-line ("BEOL") wiring structure.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present invention discloses a structure with improved adhesion between different layers of insulating or conductive materials, with thin a-Si adhesion layers disposed between the different layers, or alternately thin layers of amorphous Germanium (a-Ge) or alloys thereof. For purposes of discussion, a-Si will be described, however it is understood that the adhesion layer material may comprise a-Si, a-Ge or alloys thereof.

The present invention provides a method for improving the adhesion between different layers of insulating or conductive materials using thin a-Si bonding layers between each of the different layers.

The thin amorphous Si (a-Si) bonding layer may be used to improve the adhesion between an organic dielectric and a Si-based dielectric such as silicon oxide, silicon nitride, SiCOH, SiCH, SiCNH, or between any two dielectric layers from the group comprising the aforementioned organic and Si based dielectrics. The dielectric layers may be the main interconnect dielectric, a cap, or a hard mask layer in the back end of the line interconnect structure of an integrated circuit. While a-Si is not a low-k material, it is formed as a very thin layer as compared to the thickness of the dielectric layers, therefore its contribution to the effective dielctric constant is negligible. Furthermore, a large fraction of the a-Si layer is intermixed with the layers which it is bonding and thus converted into layers of dielectric constants smaller than a-Si. The a-Si bonding layer may also be used to improve the adhesion between a metal or metal nitride and any dielectric layer from the aforementioned group.

The electronic devices formed according to the present invention are shown in FIGS. 2–6. It should be noted that the devices shown in FIGS. 2–6, are merely illustrated as examples according to the present invention, while countless other devices can also be formed according to the present invention.

Figure 1:
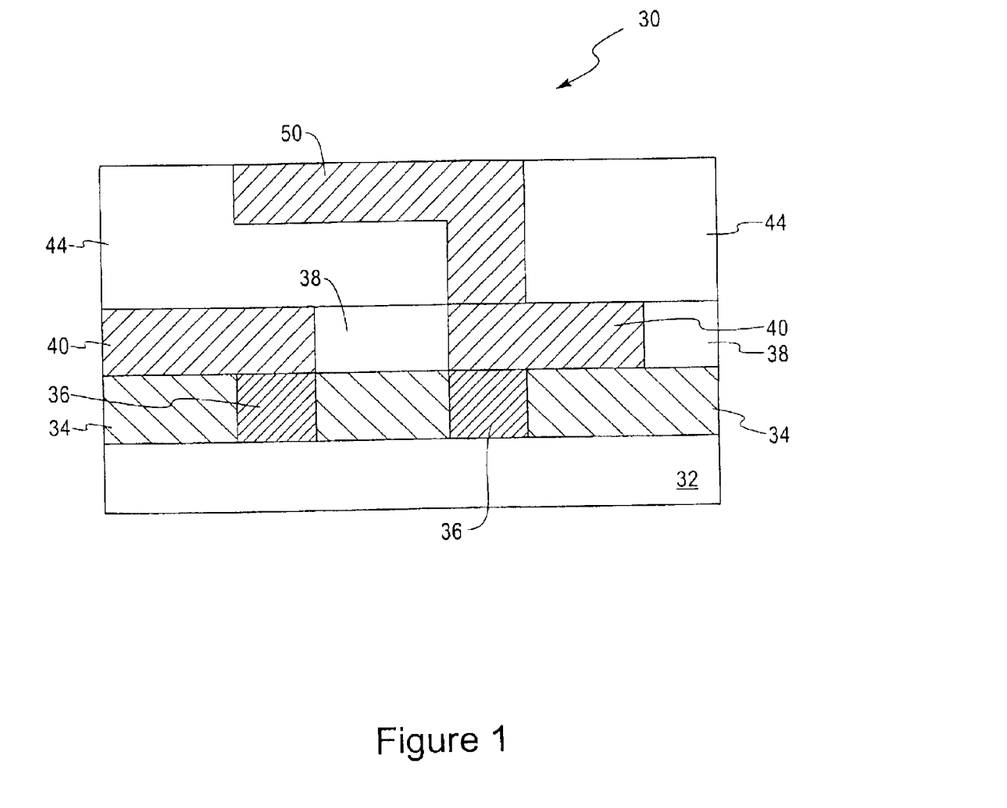
FIG. 1 depicts an enlarged, cross-sectional view of an electronic device having two layers of metallization in the BEOL according to the current state of the art.

FIG. 1 depicts electronic device 30 that is built on a silicon substrate 32 according to the current state of the art. On top of silicon substrate 32, insulating material layer 34 is formed with a first region of metal 36 embedded therein. After a chemical mechanical polishing ("CMP") process is conducted on first region of metal 36, a film such as a dielectric film 38, having preferably a dielectric constant smaller than $SiO_2$, is deposited on top of first layer of insulating material 34 and first region of metal 36.

First layer of insulating material 34 may be suitably formed of silicon oxide, silicon nitride, doped varieties of these materials, or any other suitable insulating materials. Dielectric film 38 is patterned by a photolithography process and conductor layer 40 is deposited therein. After a CMP process on first conductor layer 40 is carried out, second layer of dielectric film 44 is formed overlying first dielectric film 38 and first conductor layer 40. Conductor layer 40 may be deposited of a metallic conductive material or a non-metallic conductive material. For instance, a metallic conductive material of aluminum or copper, or a non-metallic material such as nitride or polysilicon may be utilized. The first conductor 40 is in electrical communication with the first region of metal 36.

As further depicted in FIG. 1, a second region of conductor 50 is formed after a photolithographic process in the second dielectric film layer 44, followed by a process for depositing the second conductor material. Second conductor 50 may also be deposited of either a metallic material or a non-metallic material, similar to that used in depositing the first conductor layer 40. The second region of conductor 50 is in electrical communication with the first region of conductor 40 and is embedded in the second layer of dielectric insulator 44. The second layer of dielectric film 44 is in intimate contact with the first layer of insulating material 38. In this specific example, the first layer of insulating material 38, which is a dielectric material according to the present invention, serves as an intralevel dielectric material, while the second layer of insulating material, i.e., the dielectric film 44, serves as both an intralevel and an interlevel dielectric. Based on the low dielectric constant of the dielectric film, superior insulating property can be achieved by first insulating layer 38 and second insulating layer 44.

Figure 2:
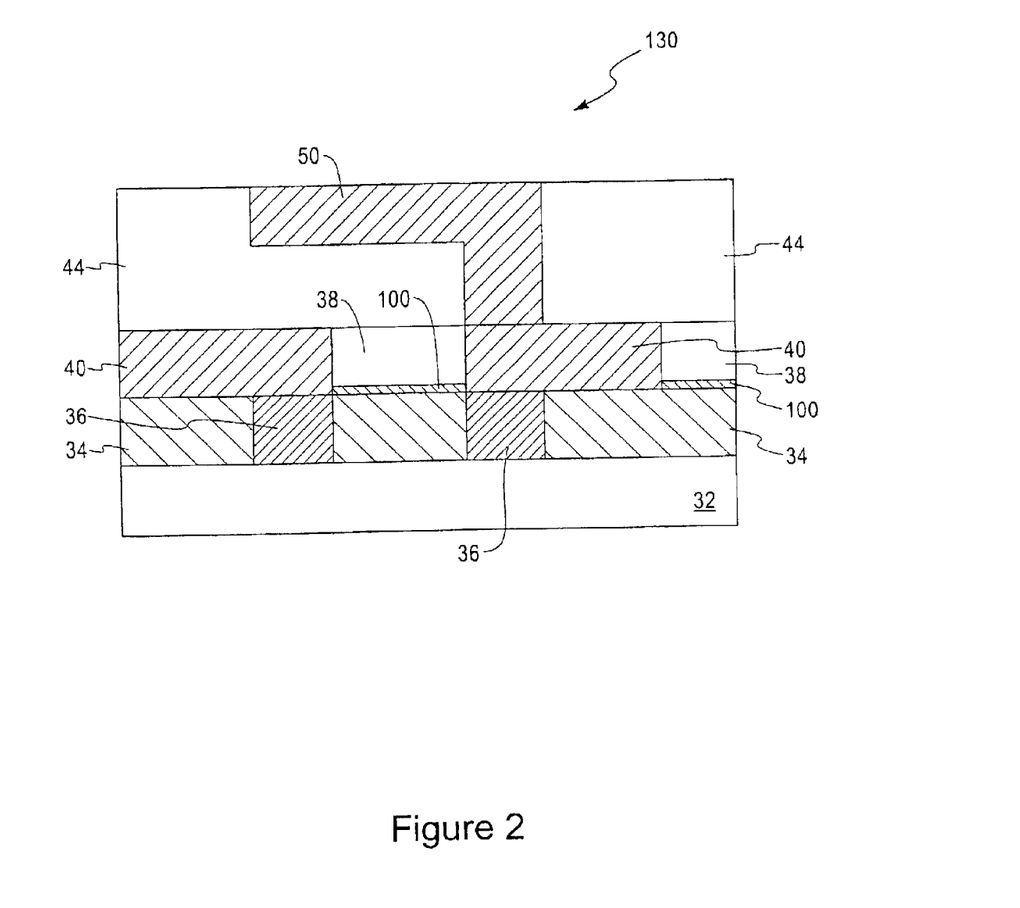
FIG. 2 depicts the structure of FIG. 1 with an additional a-Si adhesion layers between the dielectrics of the two mettalization levels according to the present invention.

FIG. 2 depicts electronic device 130 that is built on a silicon substrate 32 according to the present invention. After the formation of insulating material layer 34 with the embedded first region of metal 36, a thin layer 100 of a-Si, 1–100 nm thick, preferably 2–6 nm thick, is formed on top of layers 34 and 36. The process then continues as described with reference to FIG. 1.

Figure 3:
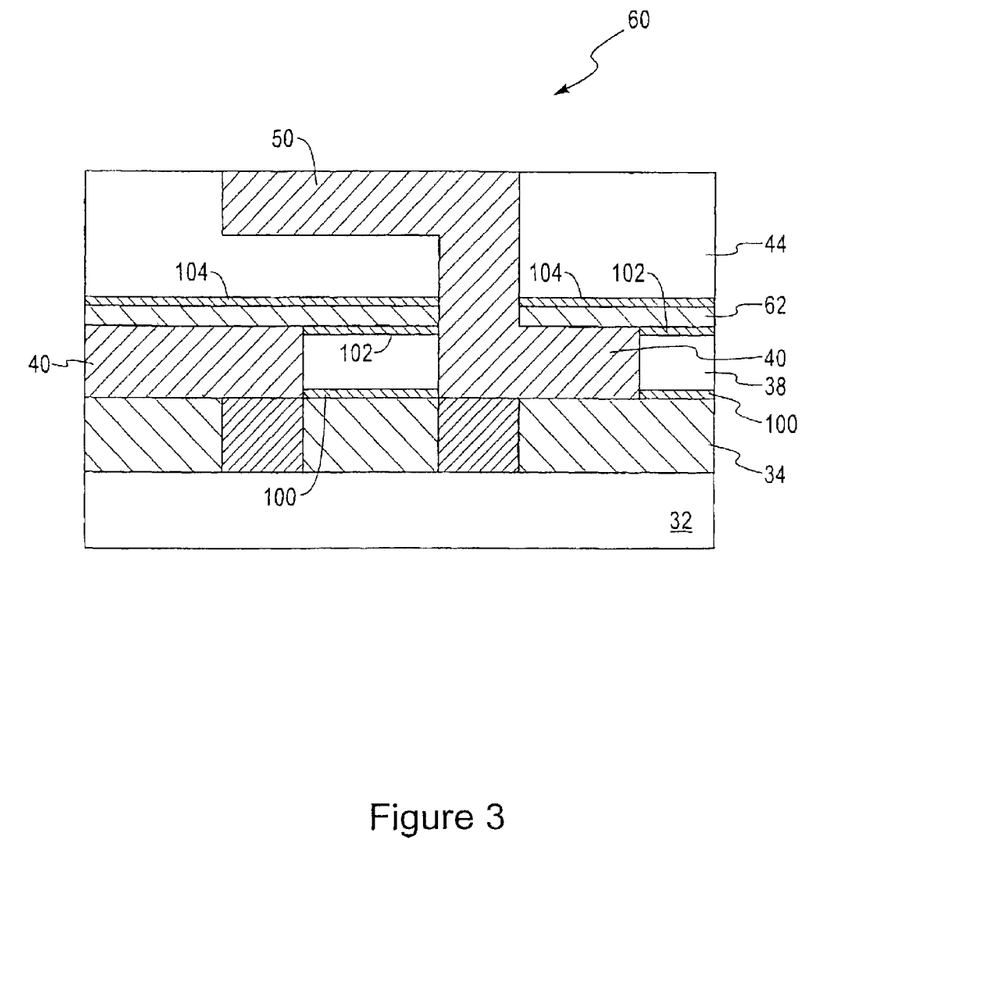
FIG. 3 depicts an enlarged, cross-sectional view of the electronic device structure of FIG. 2 having an additional diffusion barrier dielectric cap layer on top of the intralevel dielectric and a-Si adhesion layers between the diffusion barrier and the intralevel and interlevel dielectrics according to the present invention.

FIG. 3 depicts electronic device 60 according to the present invention, similar to that of electronic device 130 shown in FIG. 2, but with additional dielectric cap layer 62 deposited between first insulating material layer 38 and second insulating material layer 44. Dielectric cap layer 62 can be suitably formed of a material such as silicon oxide, silicon nitride, silicon oxynitride, silicon carbide, silicon carbo-oxide (SiCO), modified SiCOH and their hydrogenated compounds, as well as refractory metal silicon nitride, wherein the refractory metal is selected the group consisting of: Ta, Zr, Hf, and W. Additional dielectric cap layer 62 functions as a diffusion barrier layer for preventing diffusion of first conductor layer 40 into second insulating material layer 44. In one embodiment of the present invention, the adhesion between cap layer 62 and dielectric layer 38 is enhanced by the a-Si layer 102. In another embodiment, the adhesion between dielectric layer 44 and cap layer 62 is enhanced by the a-Si layer 104. In yet another embodiment the adhesion between cap layer 62 and dielectric layer 38 is enhanced by the a-Si layer 102 and the adhesion between dielectric layer 44 and cap layer 62 is enhanced by the a-Si layer 104.

Figure 4:
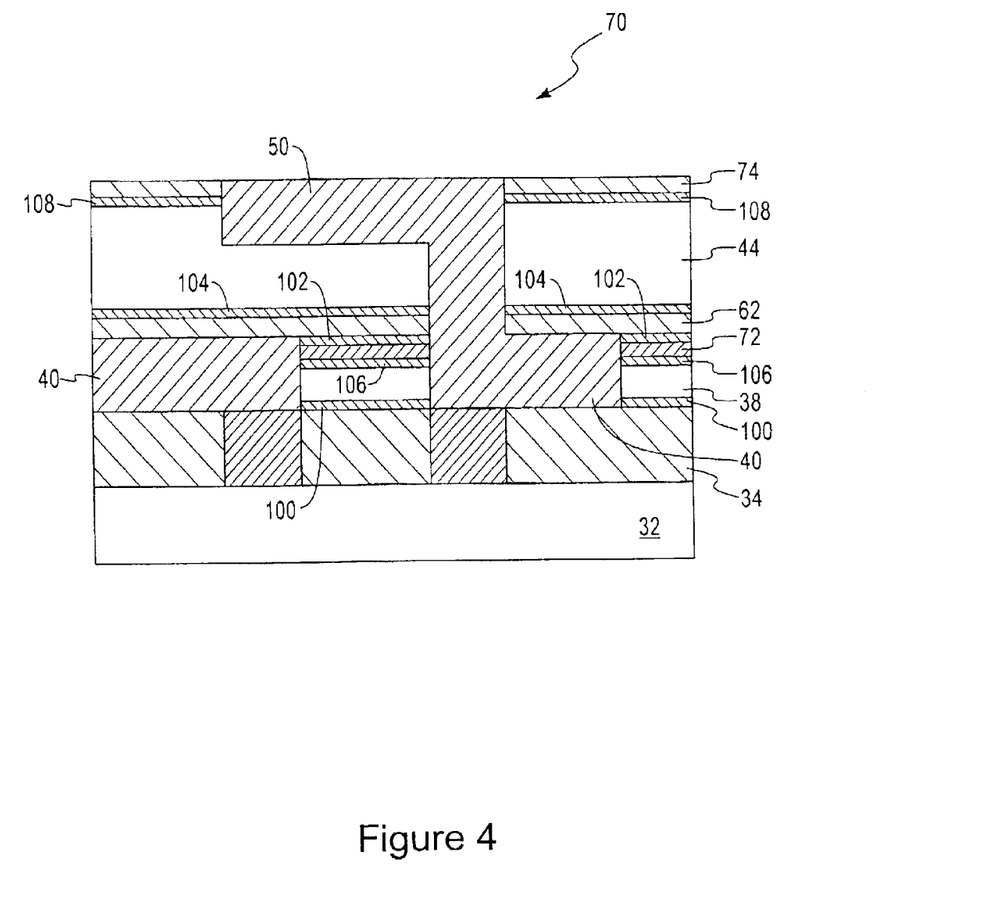
FIG. 4 depicts an enlarged, cross-sectional view of the electronic device structure of FIG. 3 having an additional RIE hard mask/polish-stop dielectric cap layer and dielectric cap diffusion barrier on top of the polish-stop layer with a-Si adhesion layers between the different dielectric layers according to the present invention.

FIG. 4 depicts another alternate embodiment of electronic device 70 according to the present invention. In electronic device 70, two additional dielectric cap layers 72 and 74 that act as an RIE mask and CMP (chemical-mechanical polishing) polish stop layer are used. First dielectric cap layer 72 is deposited on top of first insulating material layer 38. The function of dielectric layer 72 is to provide an end point for the CMP process utilized in planarizing first conductor layer 40. Polish stop layer 72 can be deposited of a suitable dielectric material such as silicon oxide, silicon nitride, silicon oxynitride, silicon carbide, silicon carbo-oxide (SiCO), modified SiCOH and their hydrogenated compounds, as well as refractory metal silicon nitride, wherein the refractory metal is selected from the group consisting of: Ta, Zr, Hf, Ti and W. The top surface of dielectric layer 72 is at the same level as first conductor layer 40. In one embodiment, the adhesion between cap layer 72 and dielectric layer 38 is enhanced by the a-Si layer 106. In another embodiment, the adhesion between dielectric layer 62 and cap layer 72 is enhanced by the a-Si layer 102. In yet another embodiment the adhesion between cap layer 72 and dielectric layer 38 is enhanced by the a-Si layer 106 and the adhesion between dielectric layer 62 and layer 72 is enhanced by the a-Si layer 102.

A second dielectric layer 74 can be added on top of second insulating material layer 44 for the same purposes. In one embodiment, the adhesion between layer 74 and dielectric layer 44 is enhanced by the a-Si layer 108.

Figure 5:
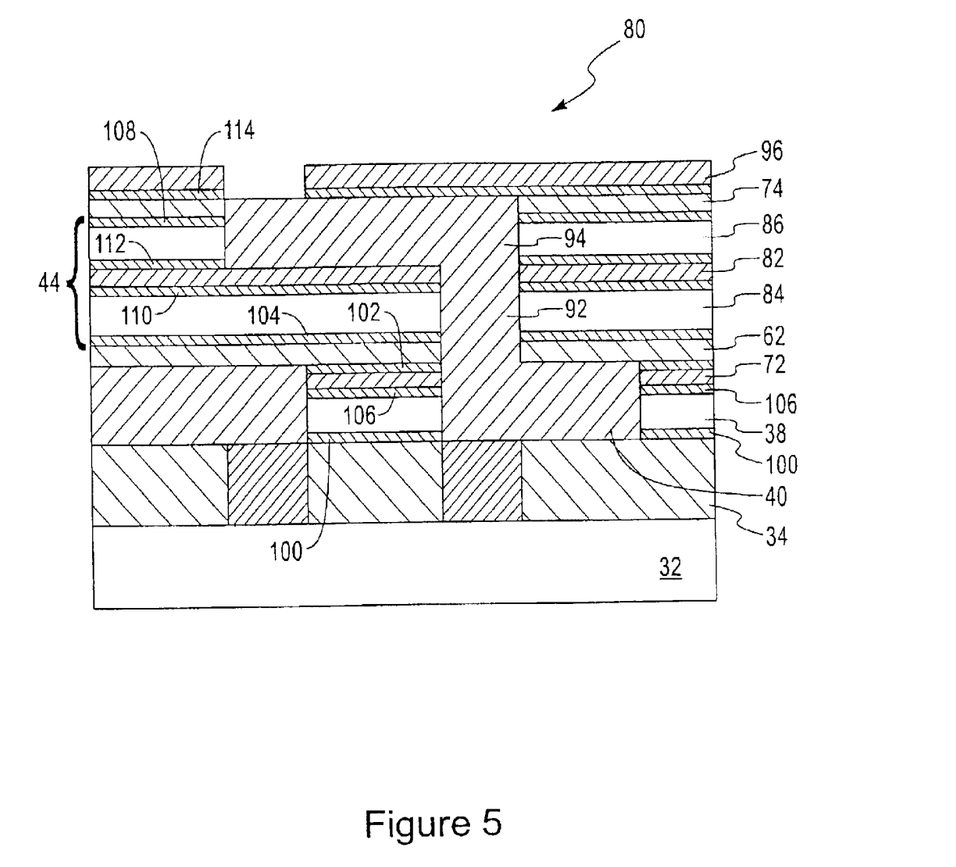
FIG. 5 depicts an enlarged, cross-sectional view of the electronic device structure of FIG. 4 having additional RIE hard mask/polish-stop dielectric layers on top of the interlevel dielectric material film with a-Si adhesion layers between the different dielectric layers according to the present invention.

FIG. 5 depicts still another alternate embodiment of electronic device 80 according to the present invention. In this alternate embodiment, an additional layer of dielectric 82 is deposited and thus divides second insulating material layer 44 into two separate layers 84 and 86. Intralevel and interlevel dielectric layer 44, as depicted in FIG. 3, is therefore divided into interlayer dielectric layer 84 and intralevel dielectric layer 86 at the boundary between interconnect 92 and interconnect 94, as depicted in FIG. 5. An additional diffusion barrier layer 96 is further deposited on top of the upper dielectric layer 74. The additional benefits provided by this alternate embodiment of the electronic structure 80 is that the dielectric layer 82 acts as a RIE etch stop providing superior interconnect depth control. In one embodiment, the adhesion between layer 82 and dielectric layer 84 is enhanced by the a-Si layer 110. In another embodiment, the adhesion between layer 86 and layer 82 is enhanced by the a-Si layer 112. In yet another embodiment the adhesion between cap layer 82 and dielectric layer 84 is enhanced by the a-Si layer 110 and the adhesion between dielectric layer 86 and layer 82 is enhanced by the a-Si layer 112. In another embodiment the adhesion between the diffusion layer 96 and dielectric layer 74 is enhanced by the a-Si layer 114. In yet another embodiment the adhesion between dielectric 74 and intralevel dielectric 86 is enhanced by the a-Si layer 108.

Figure 6:
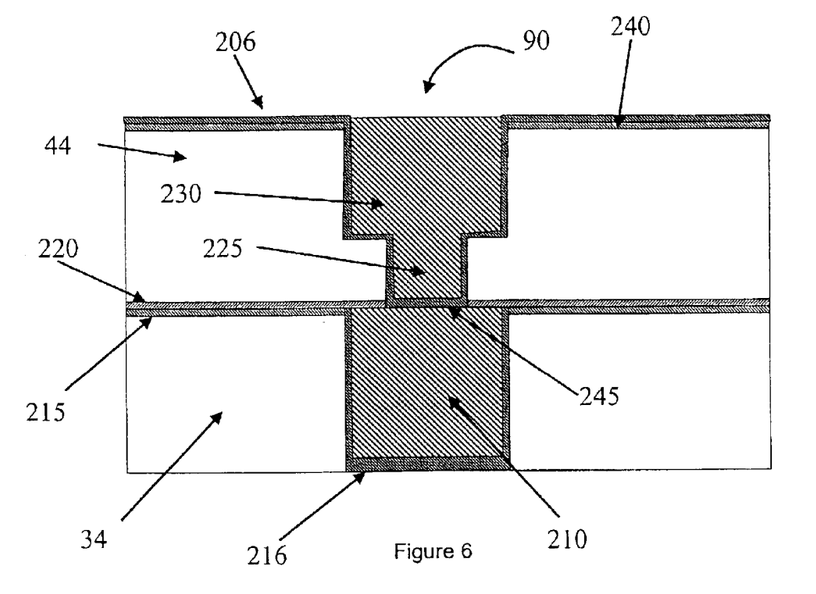
FIG. 6 depicts an enlarged, cross-sectional view an electronic device structure having a-Si adhesion layers between the hard mask/polish-stop and barrier metal layer according to the present invention.

FIG. 6 depicts still another alternate embodiment of electronic device 90 according to the present invention. In this alternate embodiment, an a-Si layer 240 is deposited and thus separates dielectric layer 44 from metal barrier layer 206. The additional benefits provided by this alternate embodiment of the electronic structure 90 is that the barrier layer 206 may be a pure metal such as Ta, W or Ti rather than a nitrided form of the metal. This allows for reduced contact resistance between the via 225 and underlying line 210 at the contact area 245 and provides increased adhesion between dielectric layer 34 and metal cap layer 220 via the remaining a-Si layer 215 present after CMP of the metal barrier layer 216.

In any of said embodiments the a-Si layer may be at least partially oxidized, for example by a short exposure to an oxygen plasma.

According to the invention, there is provided a method for fabricating the multilayered structures with strong adhesion between the different layers such as shown and described with respect to FIGS. 2–6. A preferred method comprises the steps of: providing a plasma enhanced chemical vapor deposition ("PECVD") reactor: positioning an electronic structure (e.g., semiconductor substrate) having an upper layer of first dielectric in the reactor; flowing $SiH_4$ or $SiH_4$ diluted in an inert gas into the reactor; depositing a layer of a-Si on top of said substrate; flowing precursors into the reactor for depositing a second dielectric or conductive layer on top of the a-Si bonding layer. It is understood that $GeH_4$ or $GeH_4$ diluted in an inert gas may be flown into the reactor, or alternatively, mixtures of $SiH_4$ or diluted $SiH_4$ with $GeH_4$ or diluted $GeH_4$ may be flown into the reactor. The second dielectric layer is preferably a SiCOH type dielectric of low dielectric constant (k<3.2) or ultralow dielectric constant (k<2.4), or a metal such as Ta, Ti, W, and combinations of the aforementioned, their nitrides and silicides.

The following examples are presented to illustrate the fabrication of the dielectric film including the a-Si bonding layer in accordance with the present invention as well as to demonstrate advantages that can be obtained therefrom:

EXAMPLE

In this example, a wafer containing an electronic structure (i.e., substrate) having an upper layer of first dielectric with metal structures embedded in it is inserted in a plasma enhanced chemical vapor deposition ("PECVD") reactor.

The wafer is then heated to a temperature between room temperature and 450° C. In typical conditions, the wafer is heated to 180° C. SiH$_4$ or SiH$_4$ diluted in inert gas is then flown into the reactor. In one example SiH$_4$ diluted to 2% in Ar is flown into the reactor at a rate of 30 sccm to achieve a pressure of 100 mtorr. It is understood that GeH$_4$ or GeH$_4$ diluted in an inert gas may be alternately flown into the reactor, or alternatively, mixtures of SiH$_4$ or diluted SiH$_4$ with GeH$_4$ or diluted GeH$_4$ may be flown into the reactor. An RF power source is then turned on to about 60.0 W for 0.5 to 2 minutes. In a different example, the RF power generated is operated under bias control and the a-Si layer (a-Ge or alloy thereof) is deposited at the same conditions as mentioned above but at −200 V instead of 60 W. The RF power and the gas flow are then turned off. The substrate temperature may optionally be adjusted, and the precursors used for the deposition of the next dielectric layer flown into the reactor so that the next film may be deposited.

In a different example, the wafer is removed from the reactor after the deposition of the a-Si layer and the wafer is further processed by depositing a spin-on dielectric layer.

In yet another example, after the deposition of the a-Si layer, oxygen gas is flown into the reactor and the RF power is turned on for 3 to 15 seconds to oxidize the a-Si layer at least partially.

Qualitatively, the adhesion provided by the thin a-Si bonding layer is strong enough to prevent delamination of the interconnect structure during fabrication and reliability testing. In one example, as determined in a four-point bending test known amongst skilled artisans, adhesion between two layers has been demonstrated to increase by a factor of three (3), from about 6.0 joule/m$^2$ to about 20.0 joule/m$^2$.

The method and electronic structures formed according to the present invention have therefore been thoroughly demonstrated in the above descriptions and in the drawings of FIGS. 1–6. It should be emphasized that the examples of the electronic structures shown in FIGS. 1–6 are merely used to illustrate the inventive method that can be applied in the fabrication of countless electronic devices.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A semiconductor device structure comprising:
    a substrate having a top first layer comprising dielectric material;
    a second layer comprising one from the group including: amorphous Si (a-Si) amorphous Ge (a-Ge) or alloys thereof, located on top of said first layer; and,
    a third layer located on top said a-Si layer, a-Ge layer or alloy thereof, wherein said second a-Si layer, a-Ge layer or alloy thereof, provides adhesion between said first and third layers of said structure.

2. The semiconductor structure according to claim 1, comprising a multitude of said first layer, second layer and third layers to form a multilayered structure.

3. The semiconductor structure according to claim 1, wherein said first layer of dielectric material includes metal structures embedded therein.

4. The semiconductor structure according to claim 1, wherein said amorphous Si layer, a-Ge layer or alloy thereof, is between 1 nm and 100 nm.

5. The semiconductor structure according to claim 1, wherein said amorphous Si layer, a-Ge layer or alloy thereof, is between 2 nm and 6 nm.

6. The semiconductor structure according to claim 1, wherein said amorphous Si layer, a-Ge layer or alloy thereof, is deposited by a technique from the group comprising: plasma enhanced chemical vapor deposition, high density plasma, sputtering, ion beam sputtering, and ion beam deposition.

7. The semiconductor structure according to claim 1, wherein said dielectric material of said first layer is of a material from the group comprising SiO$_2$, carbon doped glasses, carbon doped oxides, silicon oxycarbide, SiCOH, SiC, SiCN, SiCH, SiCNH, organic dielectrics or hybrid dielectrics.

8. The semiconductor structure according to claim 1, wherein said third layer located on top said a-Si layer, a-Ge layer or alloy thereof, is a dielectric layer from the group comprising SiO$_2$, carbon doped glasses, carbon doped oxides, silicon oxycarbide, SiCOH, SiC, SiCN, SiCH, SiCNH, organic dielectrics or hybrid dielectrics.

9. The semiconductor structure according to claim 1, wherein said third layer located on top said a-Si layer, a-Ge layer or alloy thereof, is a conductive layer comprising one of: a metal, a metal nitride, a ternary nitride.

10. The semiconductor structure according to claim 1, wherein said second thin layer is partially oxidized a-Si, a-Ge layer or alloy thereof.

11. A method for improving the adhesion between two different layers, with each layer comprising one of a dielectric material or a conductive material, said method comprising the steps of:
    a) supplying a substrate having a top first layer of dielectric or conductive material;
    b) depositing a second layer of material comprising one from the group including: amorphous Si (a-Si) amorphous Ge (a-Ge) or alloys thereof, on top said first layer; and,
    c) depositing a third layer on top of said a-Si layer, a-Ge layer or alloy thereof.

12. The method according to claim 11, wherein said a-Si layer, a-Ge layer or alloy thereof, is deposited by a radiation assisted technique from the group comprising: plasma enhanced chemical vapor deposition, high density plasma, sputtering, ion beam sputtering, and ion beam deposition.

13. The method according to claim 11, wherein said a-Si layer, a-Ge layer or alloy thereof, is between 1 nm and 100 nm.

14. The method according to claim 11, wherein said a-Si layer, a-Ge layer or alloy thereof, is between 2 nm and 6 nm.

15. The method according to claim 11, wherein the material of third layer is different from the material of first layer.

16. The method according to claim 11, wherein portions of said third layer are of a material identical to the material of said first layer.

17. The method according to claim 11, wherein said second thin a-Si layer, a-Ge layer or alloy thereof, is partially oxidized before the deposition of said third layer.

18. A semiconductor structure comprising:
    a dielectric layer disposed on an underlayer;
    a layer comprising material selected from the group including: amorphous Si (a-Si), amorphous Ge (a-Ge) or alloys thereof, disposed on the dielectric layer;

a barrier layer disposed on the amorphous Si layer, a-Ge layer or alloy thereof, wherein the barrier layer comprises a metal selected from the group of Ta, Ti, or W; and, a conductive layer disposed on said barrier layer.

19. The semiconductor structure of claim 18, wherein the conductive layer comprises copper or an alloy thereof.

20. The semiconductor structure of claim 18, wherein the dielectric layer is patterned to provide damascene or dual-damascene openings, said openings having sidewalls and a bottom surface in contact with the barrier layer with the top surface in contact with a-Si, a-Ge layer or alloy thereof.

21. The semiconductor structure according to claim 18, wherein said a-Si, a-Ge layer or alloy thereof, is partially oxidized.

22. An electronic device structure having layers of insulating material functioning as intralevel or interlevel dielectrics comprising:

a semiconductor substrate having a first region of metal embedded in a first layer of insulating material;

a second layer of insulating material including a first region of conductor embedded therein, said second layer of insulating material being separated from said first layer of insulating material by an adhesion layer comprising material selected from the group including: amorphous Silicon (a-Si), amorphous Ge (a-Ge) or alloys thereof, said first region of conductor being in electrical communication with said first region of metal; and, a third layer of insulating material including a second region of conductor embedded therein, said second region of conductor being in electrical communication with said first region of conductor.

23. The electronic device structure according to claim 22, further comprising: a dielectric cap layer situated between said second layer of insulating material and said third layer of insulating material, said dielectric cap layer being separated from said second layer by an a-Si adhesion layer, a-Ge layer or alloy thereof.

24. The electronic device structure according to claim 23, further comprising an adhesion layer of a-Si, a-Ge layer or alloy thereof formed between said dielectric cap layer and said third layer of insulating material.

25. The electronic device structure according to claim 22, further comprising: a first dielectric cap layer between said second layer of insulating material and said third layer of insulating material; and a second dielectric cap layer on top of said third layer of insulating material.

26. The electronic device structure according to claim 25, further comprising an a-Si adhesion layer, a-Ge layer or alloy thereof, between second dielectric cap layer and said third layer of insulating material.

27. The electronic device structure according to claim 23, wherein said dielectric cap layer is formed of a material selected from the group consisting of: silicon oxide, silicon nitride, silicon oxynitride, refractory metal silicon nitride, silicon carbide, silicon carbo-oxide, and carbon doped oxides and their hydrogen-containing compounds.

28. The electronic device structure according to claim 27, wherein said refractory metal silicon nitride includes a refractory metal selected from the group consisting of Ta, Zr, Ti, Hf and W.

29. The electronic device structure according to claim 25, wherein said first dielectric cap layer and said second dielectric cap layer are formed of a material selected from the group consisting of silicon oxide, silicon nitride, silicon oxynitride, refractory metal silicon nitride, silicon carbide, silicon carbo-oxide, carbon doped oxides and their hydrogen-containing compounds.

30. The electronic device structure according to claim 29, wherein said refractory metal silicon nitride includes a refractory metal selected from the group consisting of Ta, Zr, Hf, Ti and W.

31. The electronic device structure according to claim 22, wherein said first layer of insulating material is one selected from the group consisting of: silicon oxide, silicon nitride, phosphosilicate glass (PSG), borophosphosilicate glass (BPSG), and doped varieties of these materials.

32. The electronic device structure according to claim 22, further comprising: a diffusion barrier layer of a dielectric material deposited on at least one of said second layer of insulating material and said third layer of insulating material.

33. The electronic device structure according to claim 32, further comprising an a-Si adhesion layer, a-Ge layer or alloy thereof, between said diffusion barrier layer and said second layer of insulating material and said third layer of insulating material.

34. The electronic device structure according to claim 22, further comprising: a dielectric reactive ion etching (RIE) hard mask/polish stop layer on top of said second layer of insulating material, and a dielectric diffusion barrier layer on top of said RIE hard mask/polish stop layer.

35. The electronic device structure according to claim 34, further comprising an a-Si adhesion layer between said dielectric reactive ion etching (RIE) hard mask/polish stop layer and said second layer of insulating material, and an a-Si adhesion layer, a-Ge layer or alloy thereof, between said dielectric diffusion barrier layer and said RIE hard mask/polish stop layer.

36. The electronic device structure according to claim 22, further comprising:

a first dielectric RIE hard mask/polish stop layer on top of said second layer of insulating material;

a first dielectric diffusion barrier layer on top of said first dielectric RIE hard mask/polish stop layer;

a second dielectric RIE hard mask/polish stop layer on top of said third layer of insulating material; and a second dielectric diffusion barrier layer on top of said second dielectric RIE hard mask/polish stop layer.

37. The electronic device structure according to claim 36, further comprising an adhesion layer selected from the group including: a-Si, a-Ge or alloy thereof, between said first dielectric RIE hard mask/polish stop layer and said first dielectric diffusion barrier layer on top of said first dielectric RIE hard mask/polish stop layer.

38. The electronic device structure according to claim 36, further comprising an adhesion layer of material selected from the group including: a-Si, a-Ge or alloy thereof, between said second dielectric RIE hard mask/polish stop layer and said second dielectric diffusion barrier layer on top of said second dielectric RIE hard mask/polish stop layer.

39. The electronic device structure according to claim 22, further comprising: a dielectric cap layer between an interlevel dielectric of an dielectric material and an intralevel dielectric of an dielectric material.

40. The electronic device structure according to claim 39, further comprising an adhesion layer of material selected from the group including: a-Si, a-Ge or alloy thereof, between said dielectric cap layer and said interlevel dielectric and said intralevel dielectric.

41. The electronic device structure according to claim 22, wherein said layer of a-Si, a-Ge or alloy thereof, is partially oxidized.

42. An electronic device structure having layers of insulating material as intralevel or interlevel dielectrics comprising:
- a semiconductor substrate having a first region of metal embedded in a first layer of insulating material; and
- one or more first regions of conductor material embedded in one or more second layers of insulating material comprising a dielectric material, one of said one or more second layers of insulating material disposed above said first layer of insulating material such that a first region of said one or more first regions of conductor material is in electrical communication with said first region of metal; and,
- an adhesion layer comprising material selected from the group including: amorphous Silicon (a-Si), amorphous Ge (a-Ge) or alloys thereof, separating said one of said one or more second layers of insulating material with said first layer of insulating material.

43. The electronic device structure according to claim 42, wherein said a-Si, a-Ge or alloy thereof, is partially oxidized.

44. The electronic device structure according to claim 42, further comprising:
- a first dielectric cap layer situated between one or more of second layers of insulating material; and,
- an adhesion layer of a-Si, a-Ge or alloy thereof, disposed for enhancing bonding of each situated first dielectric cap layer with said one or more second layers of insulating material.

45. The electronic device structure according to claim 44, wherein said a-Si, a-Ge or alloy thereof, adhesion layer is partially oxidized.

46. The electronic device structure according to claim 44, further comprising:
- a second dielectric cap layer on top of a topmost second layer of insulating material; and
- an adhesion layer of a-Si, a-Ge or alloy thereof, disposed for enhancing bonding of said second dielectric cap layer with said topmost second layer of insulating material.

47. The electronic device structure according to claim 46, wherein said a-Si, a-Ge or alloy thereof, adhesion layer is partially oxidized.

48. The electronic device structure according to claim 46, wherein said first and second dielectric cap layers comprise a material selected from the group consisting of: silicon oxide, silicon nitride, silicon oxynitride, refractory metal silicon nitride, silicon carbide, silicon carbo-oxide, carbon doped oxides and their hydrogen-containing compounds.

49. The electronic device structure according to claim 48, wherein said refractory metal silicon nitride includes a refractory metal selected from the group consisting of Ta, Zr, Hf, Ti and W.

50. An electronic device structure having layers of insulating material as intralevel or interlevel dielectrics in a wiring structure comprising:
- a semiconductor substrate having a first region of metal embedded in a first layer of insulating material;
- a first region of conductor embedded in a second layer of insulating material, said second layer of insulating material disposed above said first layer of insulating material such that said first region of conductor is in electrical communication with said first region of metal;
- a second region of conductor embedded in a third layer of insulating material and being in electrical communication with said first region of conductor, said third layer of insulating material disposed above said second layer of insulating material;
- a first dielectric cap layer between said second layer of insulating material and said third layer of insulating material; and,
- adhesion layer comprising material selected from the group including: amorphous Silicon (a-Si), amorphous Ge (a-Ge) or alloys thereof, disposed for improving adhesion of said first dielectric cap layer to said insulating materials of said second layer;
- a second dielectric cap layer located on top of said third layer for improving adhesion of said second dielectric cap layer to said insulating materials of said third layer of insulating material.

51. The electronic device structure according to claim 50, wherein said a-Si, a-Ge or alloy thereof, adhesion layer may be at least partially oxidized.

52. An electronic device structure having layers of insulating material as intralevel or interlevel dielectrics in a wiring structure comprising:
- a semiconductor substrate having a first region of metal embedded in a first layer of insulating material;
- a first region of conductor embedded in a second layer of insulating material disposed above said first layer of insulating material, such that said first region of conductor is in electrical communication with said first region of metal;
- a second region of conductor embedded in a third layer of insulating material disposed above and contacting said second layer of insulating material, said second region of conductor being in electrical communication with said first region of conductor; and
- a diffusion barrier layer formed of a material comprising a dielectric material deposited on said second layer of insulating material; and,
- an adhesion layer comprising material selected from the group including: amorphous Silicon (a-Si), amorphous Ge (a-Ge) or alloys thereof, disposed for improving adhesion of said diffusion barrier layer to said insulating materials of said second layer.

53. The electronic device structure according to claim 52, wherein said a-Si, a-Ge or alloy thereof, adhesion layer may be at least partially oxidized.

54. The electronic device structure according to claim 53, further comprising an additional diffusion barrier layer formed of a material comprising a dielectric material deposited on said third layer of insulating material; and,
- an adhesion layer comprising material selected from the group including: a-Si, a-Ge or alloy thereof, disposed for improving adhesion of said diffusion barrier layer to said insulating materials of said third layer.

55. An electronic device having layers of insulating material as intralevel or interlevel dielectrics in a semiconductor structure comprising:
- a semiconductor substrate having a first region of metal embedded in a first layer of insulating material;
- a first region of conductor embedded in a second layer of insulating material disposed above said first layer of insulating material such that said first region of conductor is in electrical communication with said first region of metal;
- a second region of conductor embedded in a third layer of insulating material disposed above and contacting said second layer of insulating material, said second region of conductor being in electrical communication with said first region of conductor; and a reactive ion etch (RIE) hard mask/polish stop layer formed of a dielectric material on top of said second layer of insulating material;

a diffusion barrier layer formed of a dielectric material deposited on said RIE hard mask/polish stop layer; and, an adhesion layer comprising material selected from the group including: amorphous Silicon (a-Si), amorphous Ge (a-Ge) or alloys thereof, disposed for improving adhesion of said first reactive ion etch hard mask/polish stop layer to said insulating material of said second layer.

56. The electronic device structure according to claim 55, wherein said a-Si, a-Ge or alloy thereof, adhesion layer may be at least partially oxidized.

57. An electronic device structure having layers of insulating material as intralevel or interlevel dielectrics in a wiring structure comprising:

a semiconductor substrate having a first region of metal embedded in a first layer of insulating material;

a first region of conductor embedded in a second layer of insulating material disposed above said first layer of insulating material such that said first region of conductor is in electrical communication with said first region of metal;

a second region of conductor embedded in a third layer of insulating material disposed above and contacting said second layer of insulating material, said second region of conductor being in electrical communication with said first region of conductor;

a first reactive ion etch (RIE) hard mask/polish stop layer formed of a dielectric material on top of said second layer of insulating material;

a first diffusion barrier layer formed of a dielectric material deposited on said first RIE hard mask/polish stop layer;

an adhesion layer comprising material selected from the group including: amorphous Silicon (a-Si), amorphous Ge (a-Ge) or alloys thereof, disposed for improving adhesion of said first RIE hard mask/polish stop layer to said insulating material of said second layer and improving adhesion of said first diffusion barrier layer to said first RIE hard mask/polish stop layer;

a second RIE hard mask/polish stop layer formed of a dielectric material on top of said third layer of insulating material;

a second diffusion barrier layer formed of a dielectric material deposited on said second RIE hard mask/polish stop layer; and, an adhesion layer comprising material selected from the group including: a-Si, a-Ge or alloy thereof, disposed for improving adhesion of said second RIE hard mask/polish stop layer to said insulating material of said third layer and improving adhesion of said second diffusion barrier layer to said second RIE hard mask/polish stop layer.

58. The electronic device structure according to claim 57, wherein one or each of said a-Si, a-Ge or alloy thereof, adhesion layers may be at least partially oxidized.

59. The electronic device structure according to claim 57, further comprising:

a dielectric cap layer formed of a material comprising a dielectric material situated between an interlevel dielectric layer and an intralevel dielectric layer; and, a layer of a-Si, a-Ge or alloy thereof, disposed for improving adhesion of said dielectric cap layer to said insulating material of said interlevel dielectric layer and said intralevel dielectric layer.

60. An electronic device structure having layers of insulating material as intralevel or interlevel dielectrics in a wiring structure comprising:

a semiconductor substrate having a first region of metal embedded in a first layer of insulating material;

a first region of conductor embedded in a second layer of insulating material disposed above said first layer of insulating material such that said first region of conductor is in electrical communication with said first region of metal;

a first metal barrier layer formed on top said second layer of insulating material and surrounding said conductor region embedded therein; and, a first layer of material selected from the group including: amorphous Silicon (a-Si), amorphous Ge (a-Ge) or alloys thereof, disposed for improving adhesion of at least a portion of said metal barrier layer that contacts said insulating material of said second layer.

61. The electronic device structure according to claim 60, wherein said a-Si, a-Ge or alloy thereof, adhesion layer is partially oxidized.

62. The electronic device structure according to claim 60, wherein said first region of conductor embedded in said second layer of insulating material includes a via, said via surrounded by a second metal barrier for enabling electrical contact between said first region of conductor and said first region of metal, said structure further comprising a metal cap layer formed at an intersection between said first and second layers of insulating material, and a second layer of a-Si, a-Ge or alloy thereof, disposed for improving adhesion of at least a portion of said metal cap layer that contacts said insulating material of said first layer.

63. The electronic device structure according to claim 62, wherein said a-Si, a-Ge or alloy thereof, adhesion layer is partially oxidized.

* * * * *